United States Patent [19]
Gordon

[11] Patent Number: 5,389,401
[45] Date of Patent: Feb. 14, 1995

[54] CHEMICAL VAPOR DEPOSITION OF METAL OXIDES

[76] Inventor: Roy G. Gordon, 22 Highland St., Cambridge, Mass. 02138

[21] Appl. No.: 200,678

[22] Filed: Feb. 23, 1994

[51] Int. Cl.⁶ .............................................. C23C 16/40
[52] U.S. Cl. .............................. 427/255.2; 427/255.1; 427/248.1; 427/126.2; 427/126.3
[58] Field of Search ............... 427/255.2, 255.1, 248.1, 427/126.2, 126.3

[56] References Cited

PUBLICATIONS

Pierson, "Handbook of Chemical Vapor Deposition (CVD), Principles, Technology and Applications", Noyes Publications (1992), N.J., U.S.A., pp. 226–242.

*Primary Examiner*—Roy V. King
*Attorney, Agent, or Firm*—Samuels, Gauthier & Stevens

[57] ABSTRACT

Films of metal oxides are deposited from vaporized precursor compounds, such as metal alkoxides, by reaction with the vapor of a compound, such as cyclohexenone, that is derived formally from a stable aromatic compound by replacing one hydrogen with a ketone functional group (=O) and adding three hydrogen atoms to other atoms in the aromatic system. For example, the vapor of titanium (IV) isopropoxide reacts with the vapor of 2-cyclohexen-1-one to deposit titanium dioxide at 400° C. The deposit is highly transparent and free of carbon impurity. This vapor mixture with added aluminum isopropoxide deposits a highly insulating film of aluminum-doped titanium dioxide.

12 Claims, No Drawings

CHEMICAL VAPOR DEPOSITION OF METAL OXIDES

BACKGROUND OF THE INVENTION

Metal oxides may be formed by reactions of vapors of a wide variety of metal-containing compounds. These processes are called chemical vapor deposition (CVD) processes.

One widely-used family of metal CVD precursors are the metal alkoxides, having the general form $M(OR)_n$, in which M represents a metal atom, and R stands for an organic radical, such as methyl, ethyl, isopropyl, etc. Examples of this family include titanium isopropoxide, aluminum isopropoxide and tetraethylorthosilicate. When vapors of these alkoxides reach a heated surface, a layer containing the corresponding metal oxide is deposited on the surface.

The layers thus deposited, however, are usually found to contain significant amounts of carbon, resulting from incomplete removal of the carbon-containing organic radicals. This carbon contamination can result in deleterious effects on the properties of the metal oxide, such as increased absorption of light. One method for reducing this carbon contamination is to add an oxidant, such as oxygen or ozone, to the metal alkoxide vapor. Another sometimes beneficial effect of the oxidant is often to reduce the temperature required for the CVD process.

The presence of an oxidant vapor in the process may, however, also have deleterious effects. For example, in order to produce an electrically conductive doped titanium dioxide layer, it is advantageous to maintain a non-oxidizing atmosphere in the CVD process chamber. Addition of an oxidant gas into the CVD process results in an insulating doped titanium oxide film. In other cases, the oxidant may damage a substrate by oxidizing it or producing an undesirable oxide layer on the substrate. For example, silicon grows an insulating oxide layer on its surface when heated in an oxidizing atmosphere. If one wants to grow a metal oxide layer on the silicon without the intervening silicon oxide layer, then the CVD process must be carried out in the absence of an oxidant.

Another difficultly with metal alkoxide precursors arises when one tries to deposit mixtures of metal oxides. Each metal alkoxide has a narrow temperature range under which its CVD process operates. For example, titanium isopropoxide is usually used at temperatures from 400° to 500° C. whereas tetraethylorthosilicate does not decompose until the temperature is above about 600° C., in the absence of an added oxidant.

Another class of metal oxide precursors are the metal halides, including fluorides, chlorides, bromides and iodides. Such compounds, lacking oxygen, obviously need an oxygen source to react with in order to produce a metal oxide film. Oxygen gas is sometimes used, leading in some cases to the difficulties discussed above for an oxidizing atmosphere. Water is sometimes used in a non-oxidizing atmosphere, but reaction with water vapor can be too rapid, leading to the formation of particulates which can contaminate the film and cause pin-holes and porous films.

SUMMARY OF THE INVENTION

A principal object of the present invention is to deposit metal oxides having high purity, not contaminated by elements remaining from the metal ligands, such as carbon, nitrogen or chlorine.

Another object of the present invention is the facile deposition of metal oxide films containing more than one metal.

A further object of the present invention is to deposit metal oxides from a non-oxidizing atmosphere, so as not to oxidize the substrate for the deposition.

A related object is to deposit metal oxides in a non-oxidizing atmosphere, so that n-type doped metal oxides are formed in a highly conductive state.

Another object of the invention is to provide a chemical vapor deposition process with a controlled rate and low rate of formation of particles.

Other objects of the invention will be obvious to those skilled in the art on reading the instant invention.

The above objects have been substantially achieved by a process for the chemical vapor deposition of metal oxides using as a source of oxygen an aromatic compound to which a ketone group and two hydrogen atoms have been added. One preferred embodiment uses 2-cyclohexen-1-one. Another preferred embodiment uses substituted cyclohexenones, such as 3-methyl-2-cyclohexen-1-one. Other preferred embodiments use γ-butyrolactone or 1-methyl-2pyrrolidinone.

Many different volatile metal compounds can be used as the source of the metal or metals whose oxides are to be deposited. Volatile metal alkoxides, halides and dialkylamides all function in the invention as sources of the metal. The common feature of these ligands is that they readily exchange places with phenols and other alcohols.

DESCRIPTION OF THE PREFERRED EMBODIMENT(S)

The process of the invention can be carried out in standard equipment well known in the art for chemical vapor deposition. The essential feature of all such apparatus is that it brings the vapors of the reactants into contact with a heated substrate on which the metal oxide deposits. The process can operate at a variety of pressures, including in particular normal atmospheric pressure, and also sub-atmospheric pressures.

The reactants are vaporized by means well-known in the art, including passing a carrier gas through a heated liquid or powdered solid, or injecting a liquid or a solution of a solid into a flow of heated carrier gas.

I propose below a theory of the chemical reactions which may take place during the operation of the invention. However, I do not wish to limit the invention to just this possible explanation, and offer it merely as an aid to understanding the surprising results which I have observed.

2-cyclohexen-1-one normally exists in equilibrium with small amounts of its less stable isomers, the dihydrophenols. As the vapors of the 2-cyclohexen-1-one heat up in the CVD chamber, more of it should transform to the dihydrophenol form by a hydrogen shift. For example, a 1,3 hydrogen shift leads to 3,4-dihydrophenol:

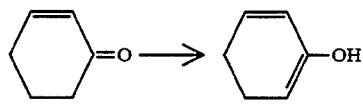

The dihydrophenol can then undergo ligand exchange with the alkoxide ligands on the titanium alkoxide, to form a titanium dienolate:

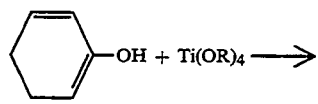

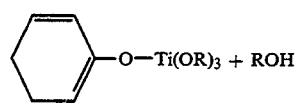

This titanium dienolate may then rearrange by a series of rapid (1,5) sigmatropic hydrogen shifts:

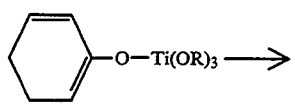

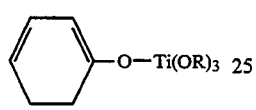

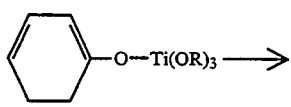

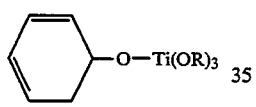

This last form of the titanium dienolate may then decompose very rapidly by a beta-hydride elimination, which is made facile by the aromatic stabilization of the benzene byproduct:

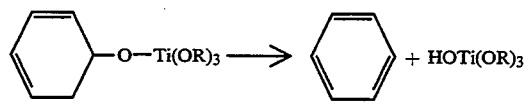

The resulting titanium hydroxide-alkoxide may then undergo a facile beta-hydride elimination of an alcohol:

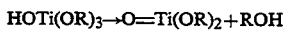

The net effect of all of the above steps is to replace two of the alkoxide ligands by an oxygen derived from the 2-cyclohexen-1-one:

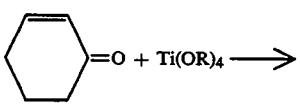

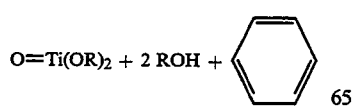

A second 2-cyclohexen-1-one reactant may then react by a similar sequence of reactions to remove the remaining two alkoxide ligands, to produce titanium dioxide:

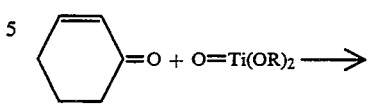

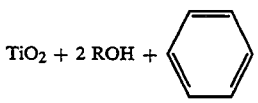

An alkyl group may be substituted for one of the hydrogens on the cyclohexenone without slowing down these reactions significantly. For example, any one of the following isomeric methyl-cyclohexenones may be used to practice this invention:

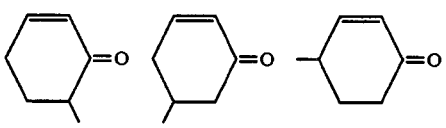

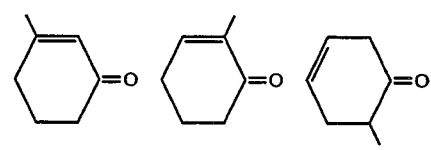

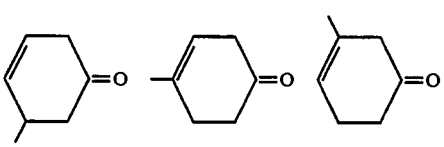

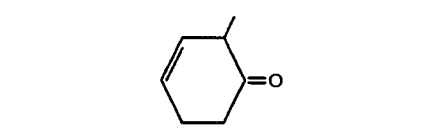

An advantage of the methyl-cyclohexenones is that the byproduct is toluene, which is less toxic than the benzene byproduct from cyclohexenone.

The cyclohexenone may have a nitrogen substituted for one or more of its CH or $CH_2$ groups, without changing these reactions significantly. Thus, in place of the cyclohexenone, one may use any one of the following isomeric pyridinones:

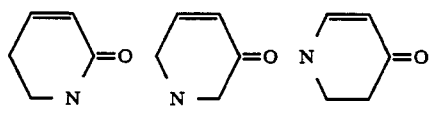

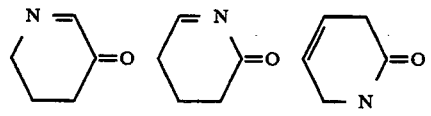

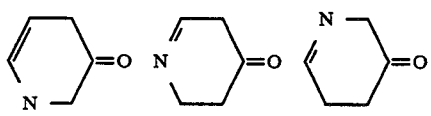

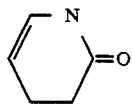

These pyridinones liberate the very stable byproduct pyridine in the last step of their reactions.

The following tetralones function in the present invention:

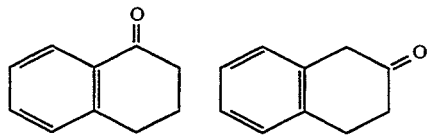

They liberate very stable aromatic byproduct naphthalene in their last reaction step.

The process of the present invention can also function with certain five-membered ring systems, such as γ-butyrolactone:

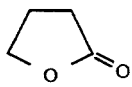

which eliminates as a byproduct the stable aromatic compound furan. Similarly, 2-pyrrolidinone,

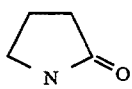

eliminates the stable aromatic compound pyrrole. 1-Methyl-2-pyrrolidinone,

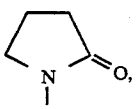

functions similarly. γ-Thiobutyrolactone,

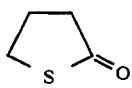

reacts similarly, releasing the aromatic compound thiophene. This sulfur compound has the disadvantage that it has a bad odor.

The following compound, 1,5,6,7-tetrahydro-4H-indol-4-one,

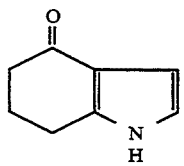

reacts to release the byproduct aromatic compound indole. It has a disadvantage that it is a solid with a low vapor pressure.

The common feature that all of these embodiments of the invention have, is that they are derived formally from a stable aromatic compound by replacing one hydrogen with a ketone functional group (=O) and adding three hydrogen atoms to other atoms in the aromatic system.

Another compound that produces the byproduct indole is 2,3-dihydro-1H-indol-2-ol:

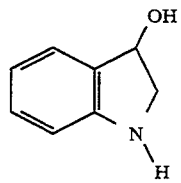

This last example is not a ketone, and thus appears at first sight not to be an example of this general rule. However, it is the more stable enol isomer (stabilized by its benzene ring) of the following ketone:

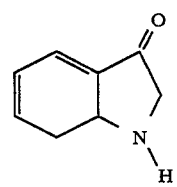

which does belong to the class of aromatic compounds in which a ketone group replaces one hydrogen atom, and three hydrogen atoms have been added to other carbon atoms in the aromatic ring system.

A similar mechanism is operative with any metal compound having ligands which can be readily exchanged with phenols. Examples of such ligands are dialkylamides and halides, as well as alkoxides.

EXAMPLE 1

2-cyclohexen-1-one was vaporized by passing a flow of one liter per minute of dry nitrogen gas at one atmosphere pressure through a bubbler containing 0.1 liter of 2-cyclohexen-1-one liquid at 90° C.

Titanium (IV) isopropoxide was vaporized by passing a flow of one liter per minute of dry nitrogen gas at one atmosphere pressure through a bubbler containing 0.1 liter of titanium (IV) isopropoxide liquid at 90° C.

The two vapor mixtures were mixed at the entrance to a CVD chamber measuring 10 cm wide by 0.6 cm high by 10 cm long (in the direction of the gas flow). A glass substrate rested on the bottom of the CVD chamber, which was heated from below, so that the glass plate was held at a temperature of about 400° C., while the top plate of the CVD chamber was at about 300° C.

Prior to the deposition and while the glass plate was heating up, dry nitrogen passed through the chamber. Valves then switched on the reactant vapor flows through the chamber for two minutes, after which the nitrogen flow was returned to the chamber, and the glass plate was removed.

The plate contained a clear, transparent coating of pure titanium oxide with a minimum thickness of about 200 nanometers.

EXAMPLE 2

Example 1 is repeated with the addition of a bubbler of tantalum (V) ethoxide held at 120° C. through which nitrogen carrier gas is passed at a rate of 0.3 liters per minute.

A deposit of electrically conductive tantalum-doped titanium dioxide is formed.

EXAMPLE 3

Example 2 is repeated, with aluminum isopropoxide in place of the tantalum (V) ethoxide. A deposit of insulating aluminum-doped titanium dioxide is formed.

EXAMPLE 4

Example 1 is repeated, except that tetaethylorthosilicate replaces the titanium (IV) isopropoxide. A layer of silicon dioxide is deposited.

EXAMPLE 5

Example 1 is repeated, except that 1-methyl-2-pyrrolidinone replaces the 2-cyclohexen-1-one, and its bubbler is heated to 100° C. Similar results are obtained.

The foregoing description has been limited to specific embodiments of the invention. Those skilled in the art will recognize or be able to ascertain using no more than routine experimentation, many equivalents to the specific embodiments of the invention described herein. Such equivalents are intended to be encompassed in the scope of the following claims.

Further, it will be apparent that variations and modifications can be made to the invention, with the attainment of some or all of the advantages of the invention. Therefore, it is the object of the appended claims to cover all such variations and modifications as come within the true spirit and scope of the invention.

Having described my invention, what I now claim is:

1. A chemical vapor deposition process for forming a metal oxide or mixture of metal oxides by reaction of the vapor of a di-hydrogenated aromatic ketone, or an isomer thereof, with the vapor of one or more metal-containing compounds having ligands exchangeable with phenols.

2. The process as in claim 1, in which the di-hydrogenated aromatic ketone is 2-cyclohexen-1-one.

3. The process as in claim 1, in which the di-hydrogenated aromatic ketone is 3-methyl-2-cyclohexen-1-one.

4. The process as in claim 1, in which the di-hydrogenated aromatic ketone is a pyridinone.

5. The process as in claim 1, in which the di-hydrogenated aromatic ketone is a tetralone.

6. The process as in claim 1, in which the di-hydrogenated aromatic ketone is a pyrrolidinone.

7. The process as in claim 1, in which the di-hydrogenated aromatic ketone is selected from the group consisting of the butyrolactones and thiobutyrolactones.

8. The process as in claim 1, in which the di-hydrogenated aromatic ketone is selected from the group consisting of the indolones and their isomers.

9. The process as in claim 1, in which the metal-containing compound contains ligands selected from the group consisting of alkoxides, alkylamides and halides.

10. The process as in claim 1, in which the metal of the metal-containing compound is selected from the group consisting of titanium, zirconium, hafnium, vanadium, niobium, tantalum, chromium, molybdenum, tungsten, aluminum, gallium, indium, germanium and tin.

11. The process as in claim 10, in which the metal is titanium.

12. The process as in claim 11, in which the metal-containing compound is a titanium alkoxide.

* * * * *